US012575095B2

(12) United States Patent
Yeh

(10) Patent No.: US 12,575,095 B2
(45) Date of Patent: Mar. 10, 2026

(54) FLASH MEMORY AND MANUFACTURING METHOD THEREOF

(71) Applicant: United Microelectronics Corp., Hsinchu (TW)

(72) Inventor: Yu-Jen Yeh, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 558 days.

(21) Appl. No.: 17/994,009

(22) Filed: Nov. 25, 2022

(65) Prior Publication Data

US 2024/0138144 A1 Apr. 25, 2024
US 2024/0237335 A9 Jul. 11, 2024

(30) Foreign Application Priority Data

Oct. 20, 2022 (TW) ................................. 111139775

(51) Int. Cl.
*H10B 41/23* (2023.01)
*H10D 30/68* (2025.01)
(52) U.S. Cl.
CPC ......... *H10B 41/23* (2023.02); *H10D 30/6892* (2025.01)
(58) Field of Classification Search
CPC ............................ H10B 42/23; H10D 30/6892
See application file for complete search history.

(56) References Cited

U.S. PATENT DOCUMENTS 6,136,653 A * 10/2000 Sung .................. H10D 30/6891
438/266
7,208,376 B2 4/2007 Chen et al.

7,391,071 B2 6/2008 Park et al.
2005/0250335 A1* 11/2005 Huang .................. H10B 69/00
438/700
2016/0163722 A1* 6/2016 Chang .................... H10D 30/68
257/316

FOREIGN PATENT DOCUMENTS

JP H02110978 4/1990
JP 2000269365 9/2000
JP 2000349176 12/2000
JP 2004104107 4/2004
JP 2009194106 8/2009

OTHER PUBLICATIONS

"Office Action of Japan Counterpart Application", issued on Apr. 16, 2024, p. 1-p. 5.

* cited by examiner

*Primary Examiner* — Monica D Harrison
*Assistant Examiner* — Jacob T Nelson
(74) *Attorney, Agent, or Firm* — JCIPRNET

(57) ABSTRACT

Provided are a flash memory and a manufacturing method thereof. In the flash memory, a first dielectric layer is disposed between a floating gate and a substrate. A second dielectric layer includes a first top surface away from the substrate, and covers the surface of the floating gate. A source region is disposed in the substrate at one side of the floating gate and in contact with the first dielectric layer. A drain region is disposed in the substrate at another side of the floating gate and separated from the first dielectric layer. An erase gate is disposed on the first top surface. A select gate is disposed on the substrate between the floating gate and the drain region. A third dielectric layer is disposed between the select gate and the substrate.

19 Claims, 14 Drawing Sheets

FLASH MEMORY AND MANUFACTURING METHOD THEREOF

CROSS-REFERENCE TO RELATED APPLICATION

This application claims the priority benefit of Taiwan application serial no. 111139775, filed on Oct. 20, 2022. The entirety of the above-mentioned patent application is hereby incorporated by reference herein and made a part of this specification.

BACKGROUND OF THE INVENTION

Field of the Invention

The disclosure relates to a semiconductor device and a manufacturing method thereof, and in particular, to a flash memory and a manufacturing method thereof.

Description of Related Art

The flash memory is a memory widely used in personal computers and other electronic apparatus because it has the advantages that the data can be stored, read or erased many times, and the stored data does not disappear after being powered off.

During the manufacturing process of a split-gate type flash memory, a polysilicon layer that is used as an erase gate is usually formed over the source region. Therefore, when the source line contacts are subsequently formed, a portion of the polysilicon layer has to be removed to form the source line contact openings. As a result, the process steps are more complicated. In addition, since the source line contacts are usually located at the edge of the memory cell array region, the distance difference between the source line contacts and these memory cells is too large, thereby resulting in the loading effect.

Further, in a general split-gate type flash memory, a floating gate is isolated from other gates (e.g., a control gate, a select gate, an erase gate, etc.) through a spacer. However, the spacer is often damaged in the following etching process, so that the floating gate may be in contact with the other gates to cause a short issue, thereby affecting the performance of the flash memory.

SUMMARY OF THE INVENTION

The present invention provides a flash memory, in which a floating gate is disposed in a substrate and wrapped by a dielectric layer, and a source line contact can be disposed on a source region between adjacent memory cells.

The present invention provides a manufacturing method of a flash memory, in which a floating gate is formed in a substrate and wrapped by a dielectric layer, and a source line contact can be formed on a source region between adjacent memory cells.

The present invention provides a flash memory including a floating gate, a first dielectric layer, a second dielectric layer, a source region, a drain region, an erase gate, a select gate, and a third dielectric layer. The floating gate is disposed in a substrate. The first dielectric layer is disposed between the floating gate and the substrate. The second dielectric layer includes a first top surface away from the substrate, and covers a surface of the floating gate. The source region is disposed in the substrate at one side of the floating gate and in contact with the first dielectric layer. The drain region is disposed in the substrate at another side of the floating gate and separated from the first dielectric layer. The erase gate is disposed on the first top surface of the second dielectric layer. The select gate is disposed on the substrate between the floating gate and the drain region. The third dielectric layer is disposed between the select gate and the substrate.

In an embodiment of the flash memory of the present invention, a top surface of the floating gate is wrapped by the first dielectric layer and the second dielectric layer.

In an embodiment of the flash memory of the present invention, the source region extends to below the floating gate.

In an embodiment of the flash memory of the present invention, a sidewall of the erase gate is located above an interface between the first dielectric layer and the source region.

In an embodiment of the flash memory of the present invention, the third dielectric layer is further located on the source region.

In an embodiment of the flash memory of the present invention, a sidewall of the erase gate is located on the third dielectric layer above the source region.

In an embodiment of the flash memory of the present invention, a sidewall of the erase gate is located on the first dielectric layer between the floating gate and the source region.

In an embodiment of the flash memory of the present invention, both sidewalls of the erase gate are located above the floating gate.

In an embodiment of the flash memory of the present invention, a sidewall of the select gate is located on the second dielectric layer.

In an embodiment of the flash memory of the present invention, the floating gate includes a bottom surface, a second top surface opposite to the bottom surface, and two side surfaces connecting to the second top surface and the bottom surface, and wherein the first dielectric layer covers the two side surfaces and the bottom surface.

In an embodiment of the flash memory of the present invention, a material of the erase gate and a material of the select gate each comprises polysilicon or metal.

In an embodiment of the flash memory of the present invention, the second dielectric layer covers the second top surface of the floating gate.

The present invention provides a manufacturing method of a flash memory including: forming a recess in a substrate; forming a floating gate in the recess; forming a first dielectric layer between the floating gate and the substrate; forming a second dielectric layer on a surface of the floating gate, wherein the second dielectric layer includes a first top surface away from the substrate; forming a source region in the substrate at one side of the floating gate, wherein the source region is in contact with the first dielectric layer; forming a third dielectric layer on the substrate at another side of the floating gate; forming an erase gate on the first top surface of the second dielectric layer; forming a select gate on the third dielectric layer; and forming a drain region in the substrate at one side of the select gate away from the floating gate.

In an embodiment of the manufacturing method of the present invention, the forming the floating gate and the first dielectric layer includes: forming a dielectric material layer on the substrate; forming a conductive material layer on the dielectric material layer, wherein the conductive material layer fills up the recess; and performing a chemical mechanical polishing process to remove a portion of the conductive material layer until exposing the dielectric material layer.

In an embodiment of the manufacturing method of the present invention, the forming the source region includes: forming a mask layer on the substrate, wherein the mask layer exposes a region aside the recess; by using the mask layer as a mask, performing an etching process to expose a surface of the substrate aside the recess; by using the mask layer as a mask, performing an ion implantation process; and removing the mask layer.

In an embodiment of the manufacturing method of the present invention, the forming the third dielectric layer includes: forming a mask layer on the substrate, wherein the mask layer exposes a region aside the recess; by using the mask layer as a mask, performing an etching process to expose a surface of the substrate aside the recess; removing the mask layer; and performing a thermal oxidation process.

In an embodiment of the manufacturing method of the present invention, the forming the erase gate and the select gate includes: forming a conductive material layer on the second dielectric layer and the third dielectric layer; and performing a patterning process on the conductive material layer.

In an embodiment of the manufacturing method of the present invention, after performing the patterning process, the method further comprises performing a gate replacement process.

In an embodiment of the manufacturing method of the present invention, the forming the drain region includes: forming a mask layer on the substrate, wherein the mask layer exposes a region aside the select gate; by using the mask layer as a mask, performing an ion implantation process; and removing the mask layer.

In an embodiment of the manufacturing method of the present invention, the method further comprises forming an isolation structure in the substrate.

Based on the above, in the present invention, the floating gate is disposed in the substrate and wrapped by a dielectric layer. Therefore, a short issue caused by the floating gate in contact with the erase gate and the select gate can be effectively avoided. In addition, in the present invention, since a region above the source region is not completely covered by the erase gate, it is not necessary to perform an additional etching process in the manufacturing process to form the source line contact opening, and the source line contact may be directly disposed in the region above the source region and is connected to the source region.

To provide a further understanding of the aforementioned and other features and advantages of the disclosure, exemplary embodiments, together with the reference drawings, are described in detail below.

DESCRIPTION OF THE EMBODIMENTS

Figure 1A:
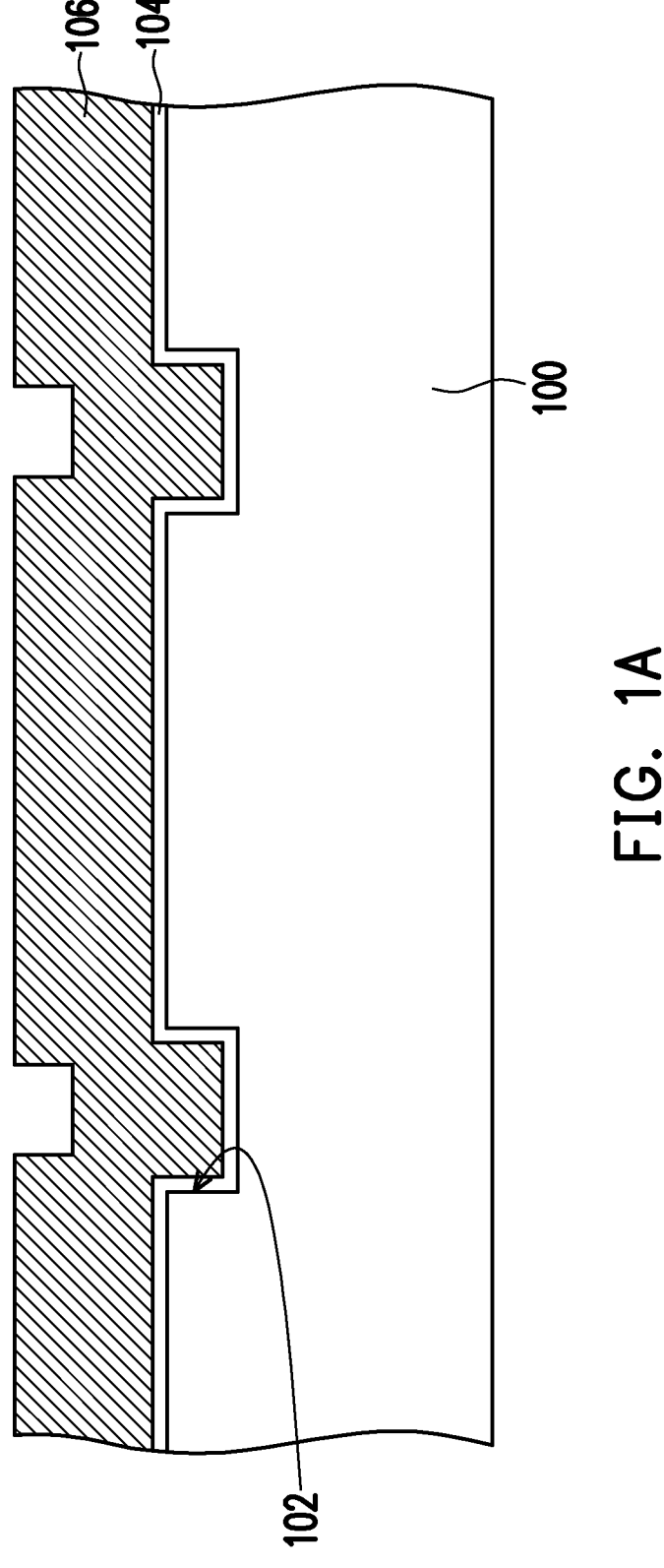
FIG. 1A to FIG. 1H are schematic cross-sectional views illustrating a manufacturing process of a flash memory according to a first embodiment of the present invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In addition, the directional terms, such as "on" and "under" mentioned in the text are only used to refer to the direction of the drawings, and are not used to limit the present invention. Thus, it will be understood that "on" is used interchangeably with "under" and that when an element such as a layer or film is placed "on" another element, the element may be directly on the other element or may be present intermediate element. On the other hand, when an element is referred to as being "directly on" another element, there is no intervening element between the two elements.

FIG. 1A to FIG. 1H are schematic cross-sectional views illustrating a manufacturing process of a flash memory according to a first embodiment of the present invention.

Referring to FIG. 1A, first, a substrate 100 is provided. In the present embodiment, the substrate 100 is, for example, a silicon substrate, but the present invention is not limited thereto. In other embodiments, the substrate 100 may also be a silicon-on-insulator (SOI) substrate. Next, a recess 102 is formed in the substrate 100. In the present embodiment, the recess 102 is a region to be subsequently formed as a floating gate. Then, a dielectric material layer is conformally formed on the substrate 100 to serve as a first dielectric layer 104. The first dielectric layer 104 is used to form a tunneling dielectric layer of the flash memory of the present embodiment. In the present embodiment, the first dielectric layer 104 is an oxide layer. In addition, in the present embodiment, the method of forming the first dielectric layer 104 is, for example, performing a thermal oxidation process on the substrate 100. Afterward, a conductive material layer 106 is formed on the first dielectric layer 104. The conductive material layer 106 is used to form the floating gate of the flash memory of the present embodiment. In the present embodiment, the conductive material layer 106 is a poly-silicon layer. In addition, in the present embodiment, the method of forming the conductive material layer 106 is, for example, performing a chemical vapor deposition (CVD)

process. In the present embodiment, the conductive material layer 106 fills up the recess 102.

Figure 1B:
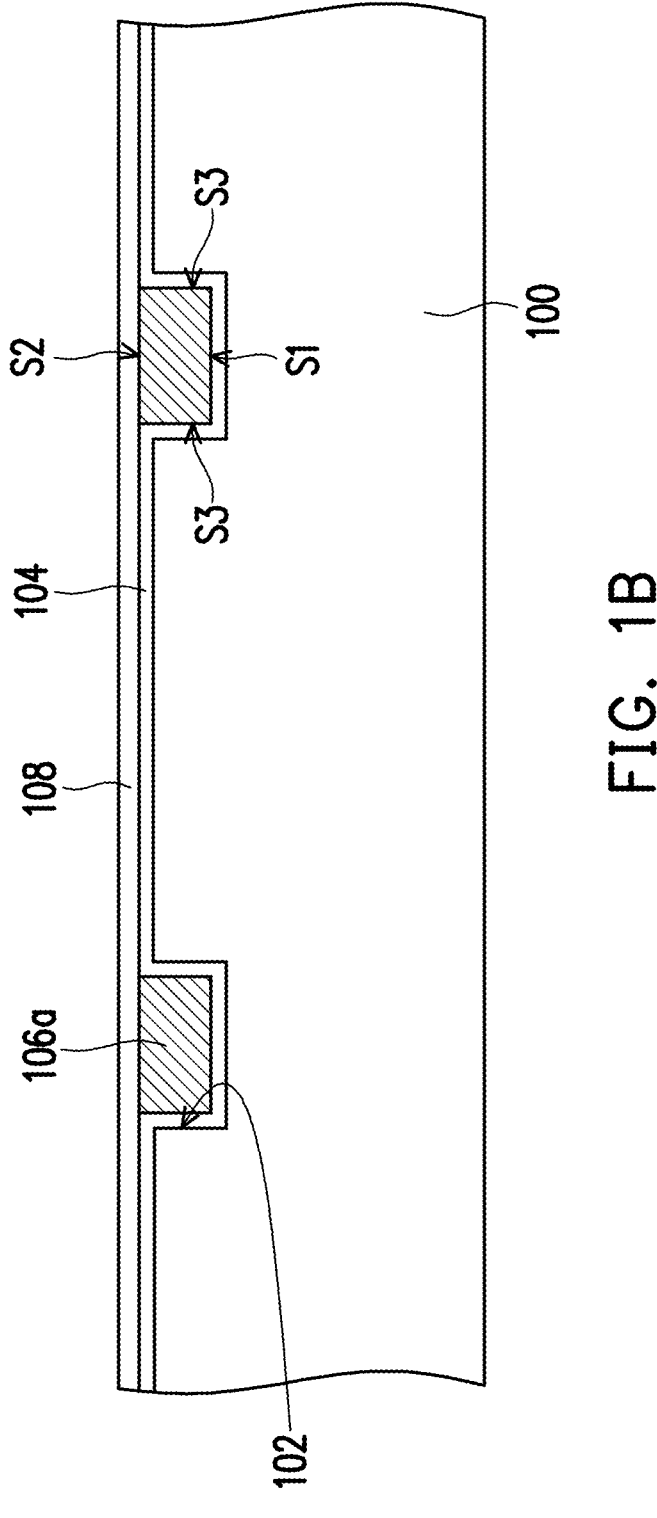

Next, referring to FIG. 1B, a chemical mechanical polishing (CMP) process is performed to remove a portion of the conductive material layer 106 until exposing the first dielectric layer 104. In this way, the floating gate 106a is formed in the recess 102, and the first dielectric layer 104 is disposed between the floating gate 106a and the substrate 100. The floating gate includes a bottom surface S1, a top surface S2 opposite to the bottom surface, and two side surfaces S3 connecting to the bottom surface S1 and the top surface S2. The first dielectric layer 104 covers the two side surfaces S3 and the bottom surface S1. In the present embodiment, since the first dielectric layer 104 is used as a polishing stop layer in the CMP process, the top surface S2 of the formed floating gate electrode 106a is higher than a top surface of the substrate 100. Thereafter, a second dielectric layer 108 is formed on the substrate 100. The second dielectric layer 108 covers the top surface S2 of the floating gate 106a exposed by the substrate 100. Therefore, in the present embodiment, the floating gate 106a is disposed in the substrate 100 and wrapped by the dielectric layer, so as to effectively prevent the floating gate 106a from contacting other gates formed subsequently. That is, in the present embodiment, there is no need to form additional spacers to ensure that the floating gate 106a will not be in contact with other gates formed subsequently, thereby simplifying the process steps of the flash memory.

Figure 1C:
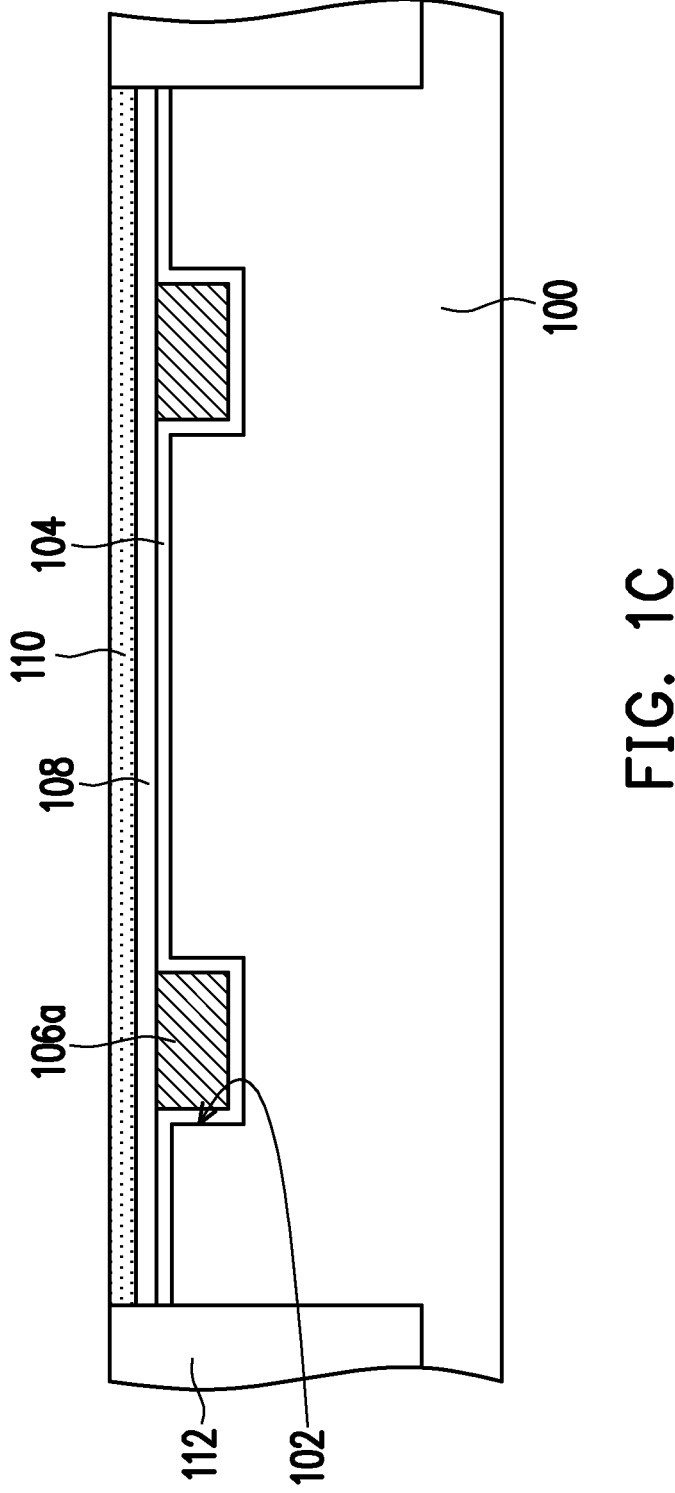

Afterward, referring to FIG. 1C, a mask layer 110 is formed on the substrate 100. The mask layer 110 exposes a region corresponding to where an isolation structure will be formed in the substrate 100. In the present embodiment, the mask layer 110 is a nitride layer, but the present invention is not limited thereto. Next, by using the mask layer 110 as an etching mask, an etching process is performed to remove a portion of the second dielectric layer 108, a portion of the first dielectric layer 104 and a portion of the substrate 100 to form a trench (not shown). Then, an insulating material is filled in the formed trench to form an isolation structure 112. In the present embodiment, the isolation structure 112 is a shallow trench isolation (STI) structure, but the invention is not limited thereto.

Figure 1D:
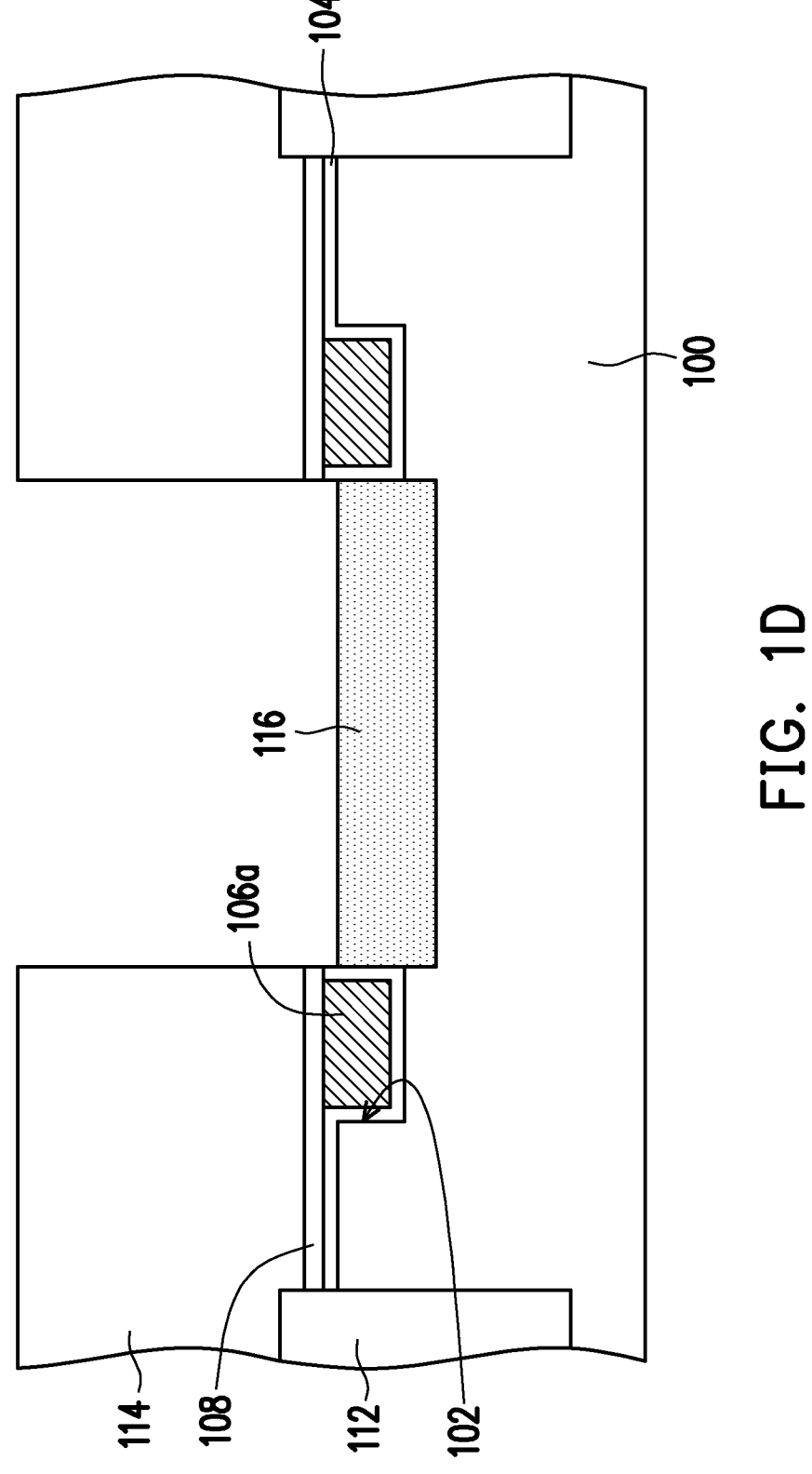

Next, referring to FIG. 1D, the mask layer 110 is removed. Then, a mask layer 114 is formed on the substrate 100. The mask layer 114 exposes a region aside the recess 102. In the present embodiment, the mask layer 114 is a photoresist layer, but the present invention is not limited thereto. In detail, in the present embodiment, the mask layer 114 exposes the region aside the recess 102 where the source region of the flash memory is to be formed, and covers other regions outside the said region, but the invention is not limited thereto. In other embodiments, depending on actual requirements, the mask layer 114 may simultaneously expose other regions where the doped regions are to be formed. Next, by using the mask layer 114 as an etching mask, an etching process is performed to remove a portion of the second dielectric layer 108 and a portion of the first dielectric layer 104 to expose the surface of the substrate 100 aside the recess 102. Then, by using the mask layer 114 as an implantation mask, an ion implantation process is performed to implant dopants into the substrate 100 aside the recess 102. As a result, a source region 116 is formed in the substrate 100 at one side of the floating gate 106a.

In the present embodiment, since a sidewall of the mask layer 114 is aligned with a sidewall of the recess 102, the second dielectric layer 108 above the first dielectric layer 104 and the floating gate 106a in the recess 102 will not be damaged during the etching process. As result, it ensures that the floating gate 106a is not be in contact with the other gates formed subsequently. In addition, since the sidewall of the mask layer 114 is aligned with the sidewall of the recess 102, the formed source region 116 may be in contact with the first dielectric layer 104 formed on the sidewall of the recess 102. In other embodiments, the sidewall of the mask layer 114 may not be aligned with the sidewall of the recess 102 and further covers the second dielectric layer 108 around the recess 102. In this case, after implanting the dopants, a thermal treatment may be performed to diffuse the dopants to form the source region 116 in contact with the first dielectric layer 104.

Figure 1E:
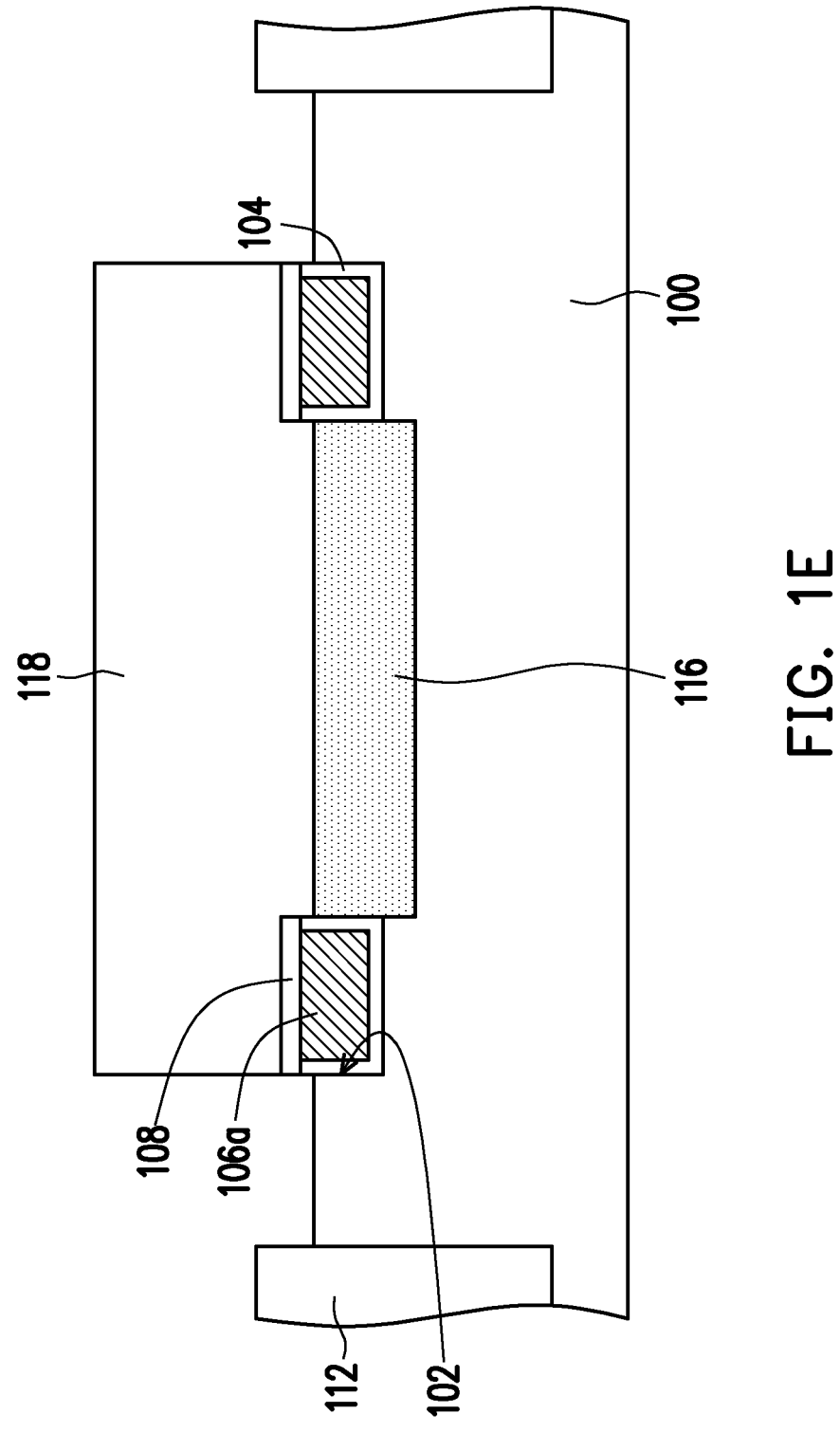

Then, referring to FIG. 1E, the mask layer 114 is removed. Next, a mask layer 118 is formed on the substrate 100. The mask layer 118 exposes a region at another side of the recess 102. In the present embodiment, the mask layer 118 is a photoresist layer, but the present invention is not limited thereto. In detail, in the present embodiment, the mask layer 118 covers a region above the recess 102 and the source region 116, and exposes a region between the recess 102 and the isolation structure 112. Afterward, by using the mask layer 118 as an etching mask, an etching process is performed to remove a portion of the second dielectric layer 108 and a portion of the first dielectric layer 104 to expose the surface of the substrate 100 aside the recess 102. In the present embodiment, since a sidewall of the mask layer 118 is aligned with the sidewall of the recess 102, the second dielectric layer 108 above the first dielectric layer 104 and the floating gate 106a in the recess 102 will not be damaged during the etching process. As a result, it ensures that the floating gate 106a is not be in contact with the other gates formed subsequently. In other embodiments, the sidewall of the mask layer 118 may not be aligned with the sidewall of the recess 102 and further covers the second dielectric layer 108 around the recess 102.

Figure 1F:
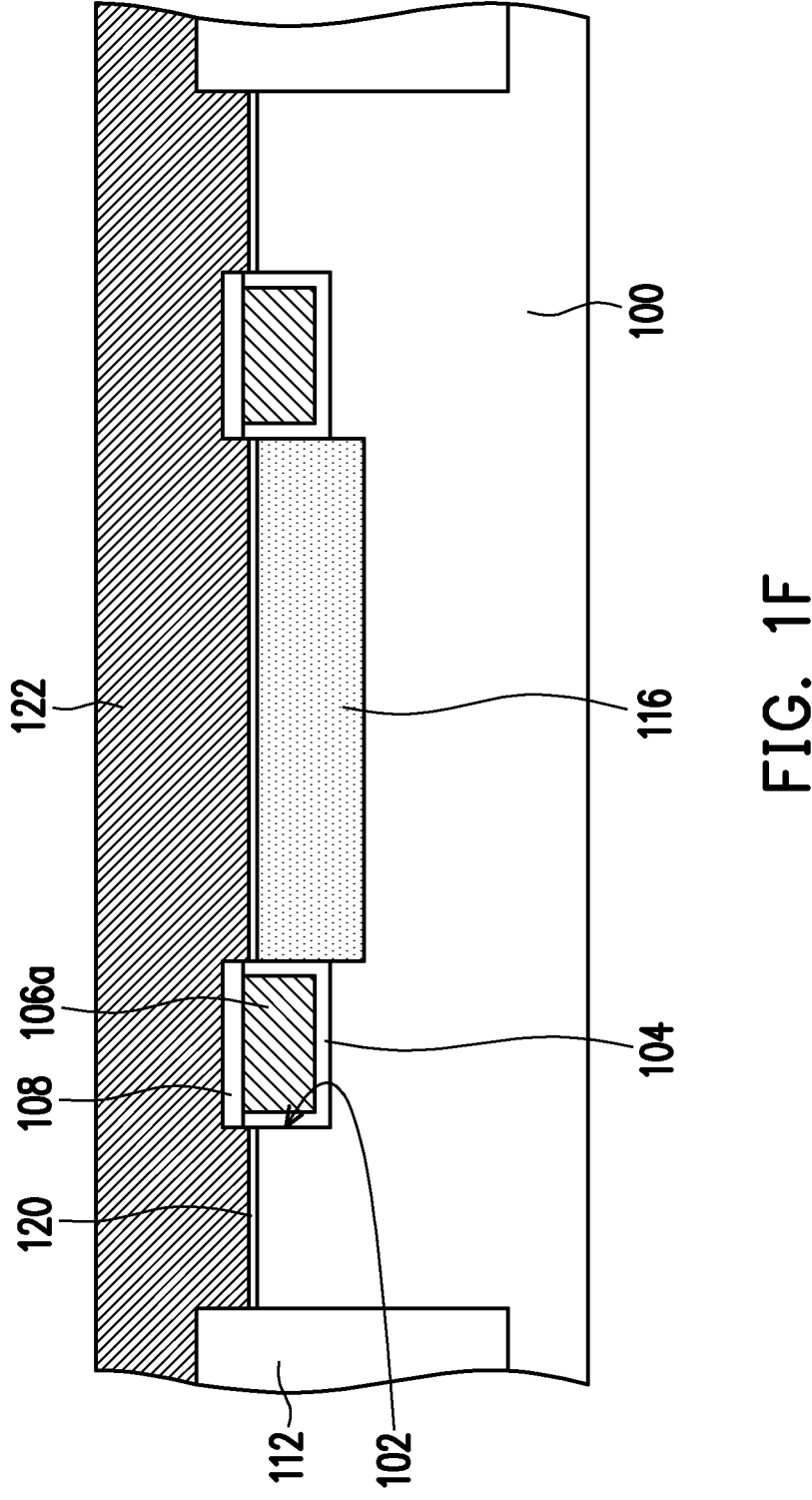

Next, referring to FIG. 1F, the mask layer 118 is removed. Then, a thermal oxidation process is performed to form a third dielectric layer 120 on the exposed surface of the substrate 100. Therefore, in the present embodiment, the third dielectric layer 120 is an oxide layer. In this way, the third dielectric layer 120 is formed on the surface of the substrate 100 outside the recess 102, and the third dielectric layer 120 covers the source region 116. Afterward, a conductive material layer 122 is formed on the substrate 100. The conductive material layer 122 covers the isolation structure 112, the second dielectric layer 108, and the third dielectric layer 120. The conductive material layer 122 is used to form the erase gate and the select gate of the flash memory of the present embodiment. In the present embodiment, the conductive material layer 122 is a polysilicon layer. In addition, in the present embodiment, the method of forming the conductive material layer 122 is, for example, a chemical vapor deposition process.

Figure 1G:
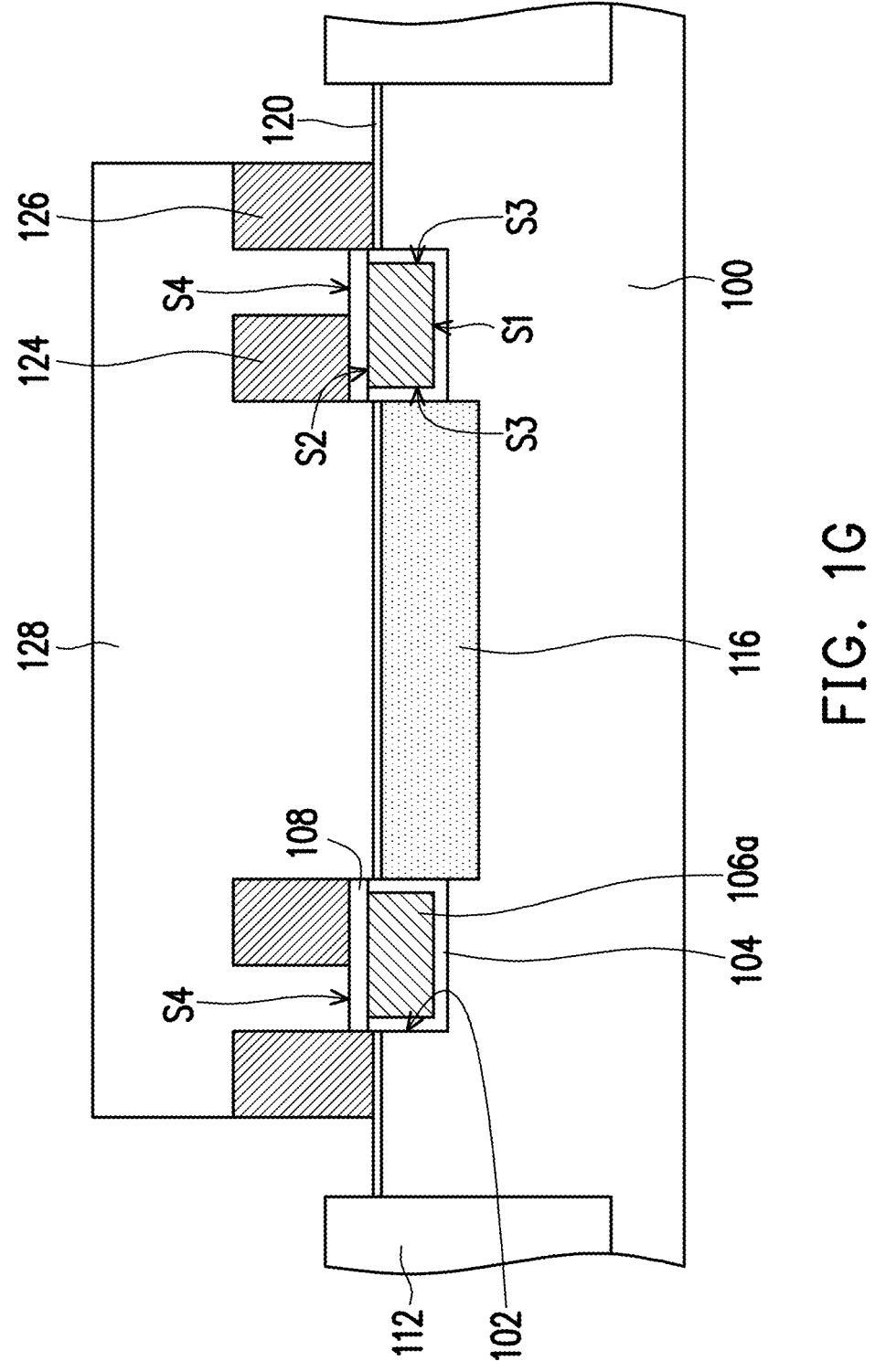

Then, referring to FIG. 1G, a patterning process is performed on the conductive material layer 122 to form an erase gate 124 and a select gate 126. Specifically, after performing the patterning process on the conductive material layer 122, the erase gate 124 is formed on a top surface S4 of the second dielectric layer 108 away from the substrate 100, and the select gate 126 is formed on the third dielectric layer 120 between the floating gate 106a and the isolation structure 112. Therefore, the second dielectric layer 108 between the erase gate 124 and the floating gate 106a may be used as an inter-gate dielectric layer, and the third dielectric layer 120 between the select gate 126 and the substrate 100 may be used as a gate dielectric layer.

In the present embodiment, the erase gate 124 and the select gate 126 are formed of a polysilicon layer used for the conductive material layer 122, but the invention is not limited thereto. In other embodiments, after performing the patterning process on the conductive material layer 122, a gate replacement process known to those skilled in the art may be performed to form the erase gate 124 and the select gate 126 made of metal materials.

Next, a mask layer 128 is formed on the substrate 100. The mask layer 128 exposes a region aside the select gate 126. In the present embodiment, the mask layer 128 is a photoresist layer, but the invention is not limited thereto. In detail, in the present embodiment, the mask layer 128 covers the second dielectric layer 108, the third dielectric layer 120 on the source region 116, the erase gate 124, and the select gate 126, while exposes the isolation structure 112 and a region between the select gate 126 and the isolation structure 112. That is, the mask layer 128 exposes the isolation structure 112 and a region where a drain region of the flash memory is to be formed, but the invention is not limited thereto. In other embodiments, depending on actual requirements, the mask layer 128 may simultaneously expose other regions where doped regions are to be formed.

Figure 1H:
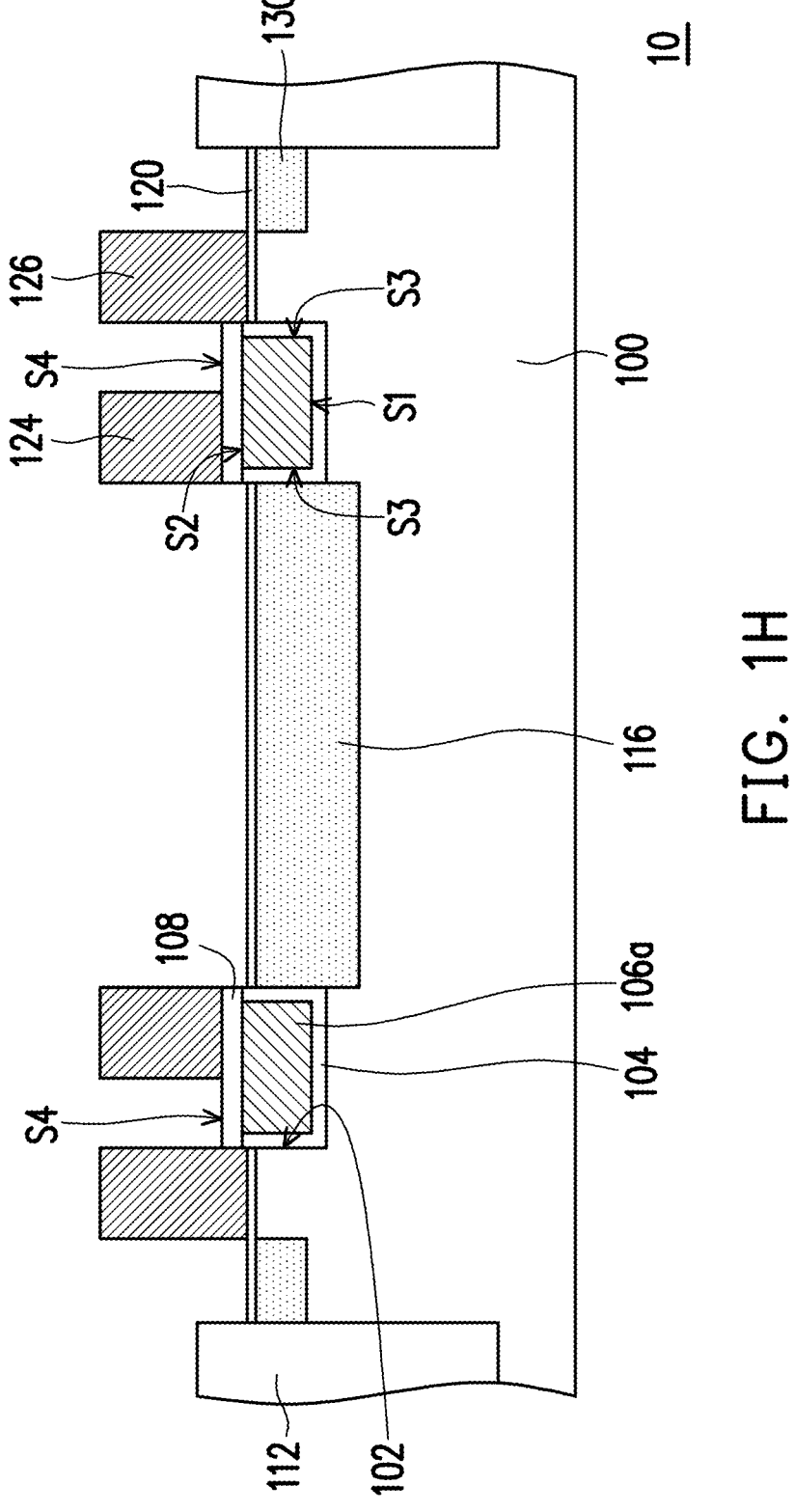

Afterward, referring to FIG. 1H, by using the mask layer 128 as an implant mask, an ion implantation process is performed to implant dopants into the substrate 100 between the select gate 126 and the isolation structure 112, thereby forming a drain region 130. Then, the mask layer 128 is removed. As a result, a flash memory 10 of the present embodiment is formed.

In the flash memory 10 of the present embodiment, the floating gate 106a is disposed in the substrate 100, the first dielectric layer 104 is disposed between the floating gate 106a and the substrate 100, and the second dielectric layer 108 covers the surface of floating gate 106a exposed by the substrate 100. That is, in the present embodiment, the floating gate 106a is wrapped by the first dielectric layer 104 and the second dielectric layer 108. Therefore, the short issue caused by the floating gate 106a in contact with the erase gate 124 and the select gate 126 can be effectively avoided.

In addition, in the flash memory 10 of the present embodiment, the source region 116 is disposed in the substrate 100 at one side of the floating gate 106a and is in contact with the first dielectric layer 104, while the drain region 130 is disposed in the substrate 100 at another side of the floating gate 106a and is separated from the first dielectric layer 104. The erase gate 124 is disposed on the second dielectric layer 108, the select gate 126 is disposed on the substrate 100 between the floating gate 106a and the drain region 130, and the third dielectric layer 120 is disposed between the select gate 126 and the substrate 100. Since the region above the source region 116 is not completely covered by the erase gate 124, the source line contact can be directly formed in the region above the source region 116 to be connected to the source region 116 in subsequent processes. That is, it is not necessary to perform an additional etching process to remove a portion of the erase gate 124 to form the source line contact opening, thereby achieving the effect of simplifying the process steps.

Further, since the above-mentioned source line contact may be formed in the region above the source region 116, that is, the source line contact may be formed between two adjacent floating gates 106a, the distances between two adjacent memory cells and the source line contact can be substantially the same to avoid the loading effect during operation.

In the flash memory 10 of the present embodiment, the boundary of the source region 116 is aligned with the sidewall of the recess 102, the entire erase gate 124 is located on the second dielectric layer 108 and a sidewall of the erase gate 124 is located above an interface between the first dielectric layer 104 and the source region 116 (i.e., the sidewall is aligned with the sidewall of the recess 102), and the entire select gate 126 is located on the third dielectric layer 120, but the present invention is not limited thereto. In other embodiments, the setting of the elements constituting the flash memory may be adjusted according to actual conditions.

Figure 2:
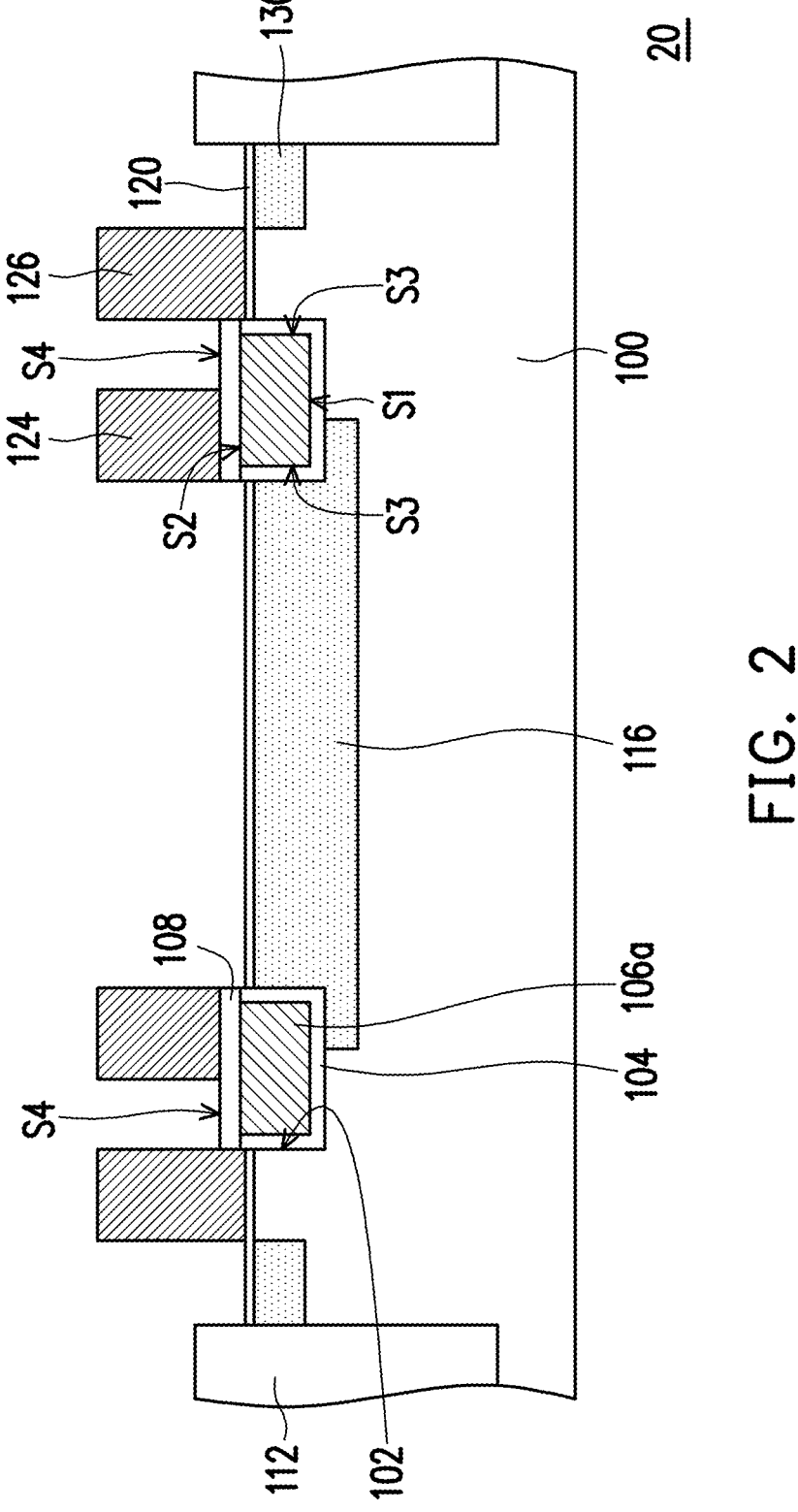
FIG. 2 is a schematic cross-sectional view of a flash memory according to a second embodiment of the present invention.

FIG. 2 is a schematic cross-sectional view of a flash memory according to a second embodiment of the present invention. In the present embodiment, the same elements as those of the first embodiment will be denoted by the same reference numerals and will not be described in detail.

Referring to FIG. 2, the difference between the flash memory 20 of the present embodiment and the flash memory 10 is that in the flash memory 20, the source region 116 is not only located in the substrate 100 aside the recess 102, but also further extends to below the floating gate 106a. That is, in the step illustrated in FIG. 1D, after implanting the dopants into the substrate 100 aside the recess 102, a heat treatment may be performed to diffuse the implanted dopants to below the floating gate 106, but the present invention is not limited thereto.

Figure 3:
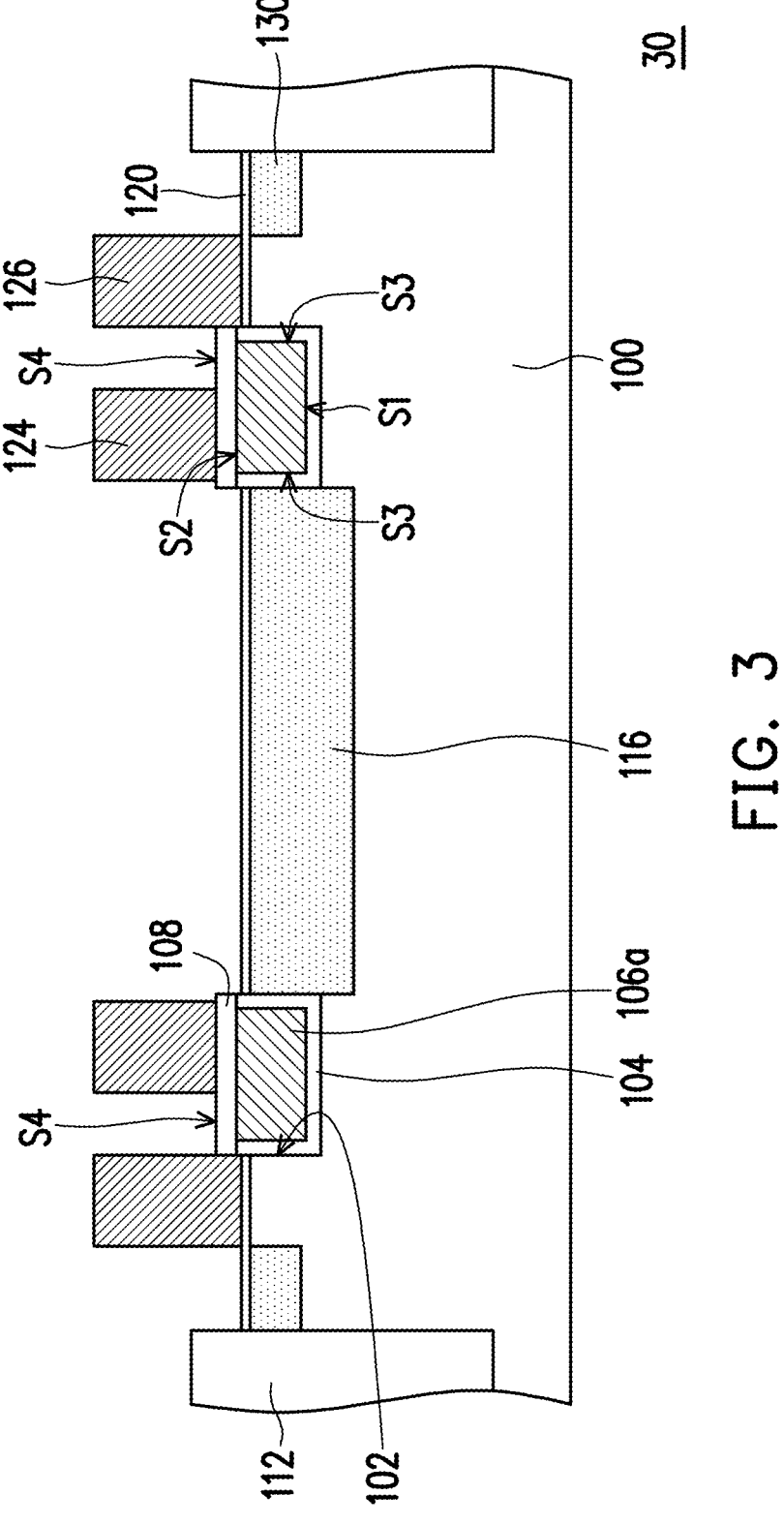
FIG. 3 is a schematic cross-sectional view of a flash memory according to a third embodiment of the present invention.

FIG. 3 is a schematic cross-sectional view of a flash memory according to a third embodiment of the present invention. In the present embodiment, the same elements as those of the first embodiment will be denoted by the same reference numerals and will not be described in detail.

Referring to FIG. 3, the difference between the flash memory 30 of the present embodiment and the flash memory 10 is that in the flash memory 30, the entire erase gate 124 is located on the second dielectric layer 108, and a sidewall of the erase gates 124 is located on the first dielectric layer 104 between the floating gate 106a and the source region 116. That is, the sidewall of the erase gate 124 is not aligned with the sidewall of the recess 102.

Figure 4:
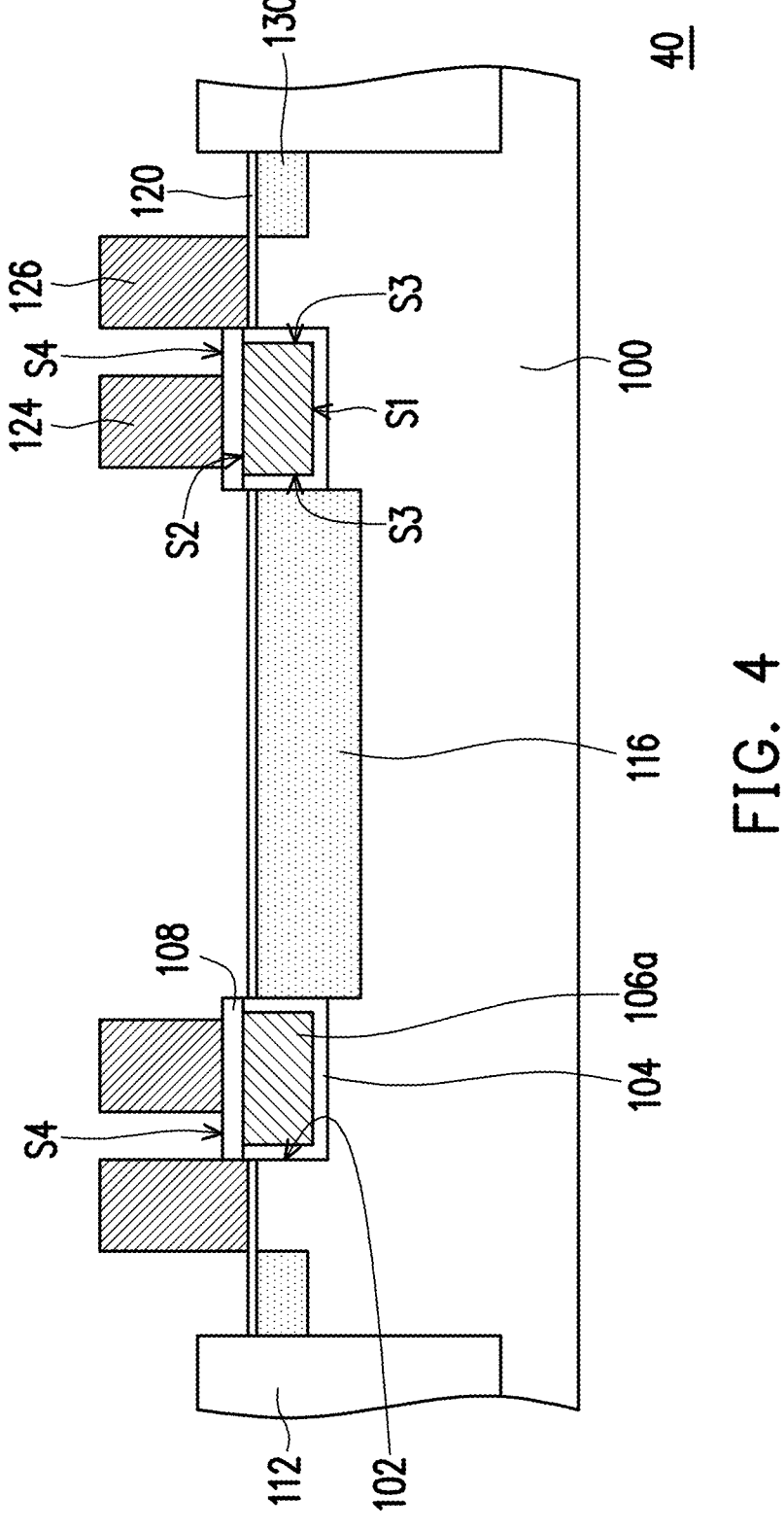
FIG. 4 is a schematic cross-sectional view of a flash memory according to a fourth embodiment of the present invention.

FIG. 4 is a schematic cross-sectional view of a flash memory according to a fourth embodiment of the present invention. In the present embodiment, the same elements as those of the first embodiment will be denoted by the same reference numerals and will not be described in detail.

Referring to FIG. 4, the difference between the flash memory 40 of the present embodiment and the flash memory 10 is that in the flash memory 40, the entire erase gate 124 is located on the second dielectric layer 108, and both sidewalls of the erase gate 124 are located directly above the floating gate 106a. That is, the sidewalls of the erase gate 124 are not aligned with the sidewalls of the recess 102.

Figure 5:
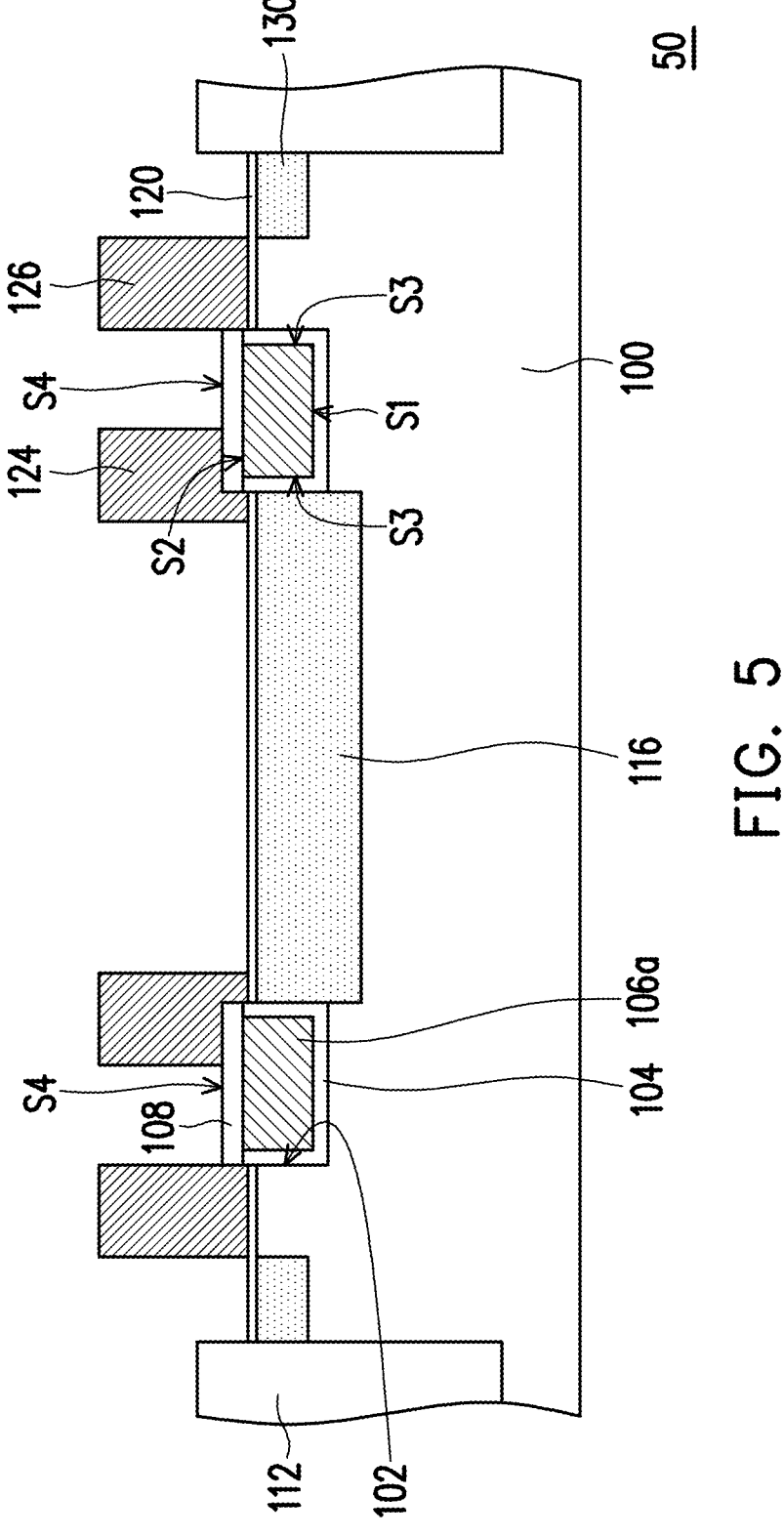
FIG. 5 is a schematic cross-sectional view of a flash memory according to a fifth embodiment of the present invention.

FIG. 5 is a schematic cross-sectional view of a flash memory according to a fifth embodiment of the present invention. In the present embodiment, the same elements as those of the first embodiment will be denoted by the same reference numerals and will not be described in detail.

Referring to FIG. 5, the difference between the flash memory 50 of the present embodiment and the flash memory 10 is that in the flash memory 50, the erase gate 124 is not only located on the second dielectric layer 108, but also located on the third dielectric layer 120. That is, in the present embodiment, a sidewall of the erase gate 124 is located on the second dielectric layer 108 directly above the floating gate 106a, and another sidewall of the erase gate 124 is located on the third dielectric layer 120. Accordingly, the erase gate 124 is located above the floating gate 106a and the source region 116 simultaneously.

Figure 6:
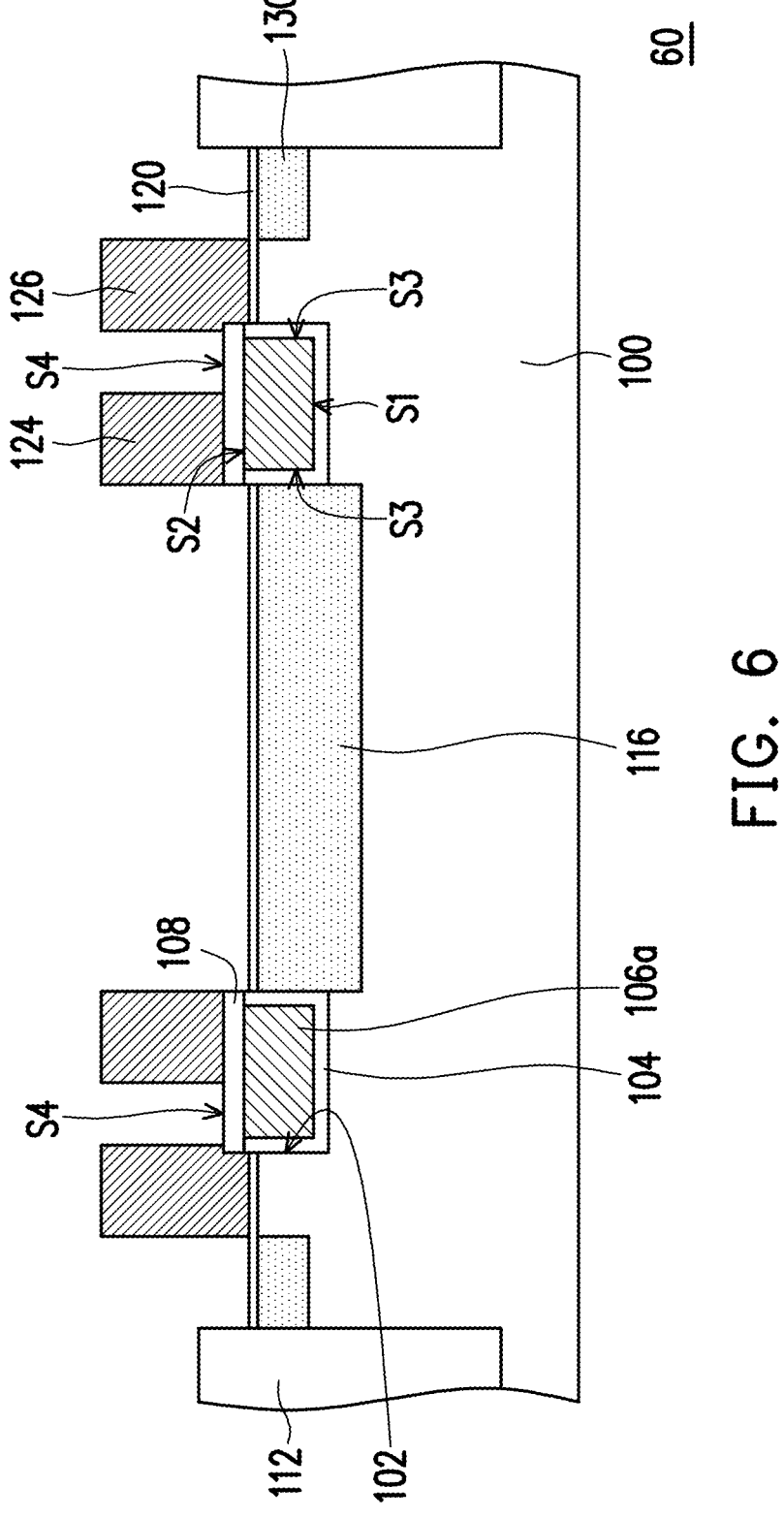
FIG. 6 is a schematic cross-sectional view of a flash memory according to a sixth embodiment of the present invention.

FIG. 6 is a schematic cross-sectional view of a flash memory according to a sixth embodiment of the present invention. In the present embodiment, the same elements as those of the first embodiment will be denoted by the same reference numerals and will not be described in detail.

Referring to FIG. 6, the difference between the flash memory 60 of the present embodiment and the flash memory 10 is that in the flash memory 60, a sidewall of the select gate 126 is located on the second dielectric layer 108. In detail, in the present embodiment, a sidewall of the select gate 126 is located on the third dielectric layer 120, and another sidewall of the select gate 126 is located on the first dielectric layer 104 between the floating gate 106a and the sidewall of the recess 102 and will not contact the erase gate 124.

Figure 7:
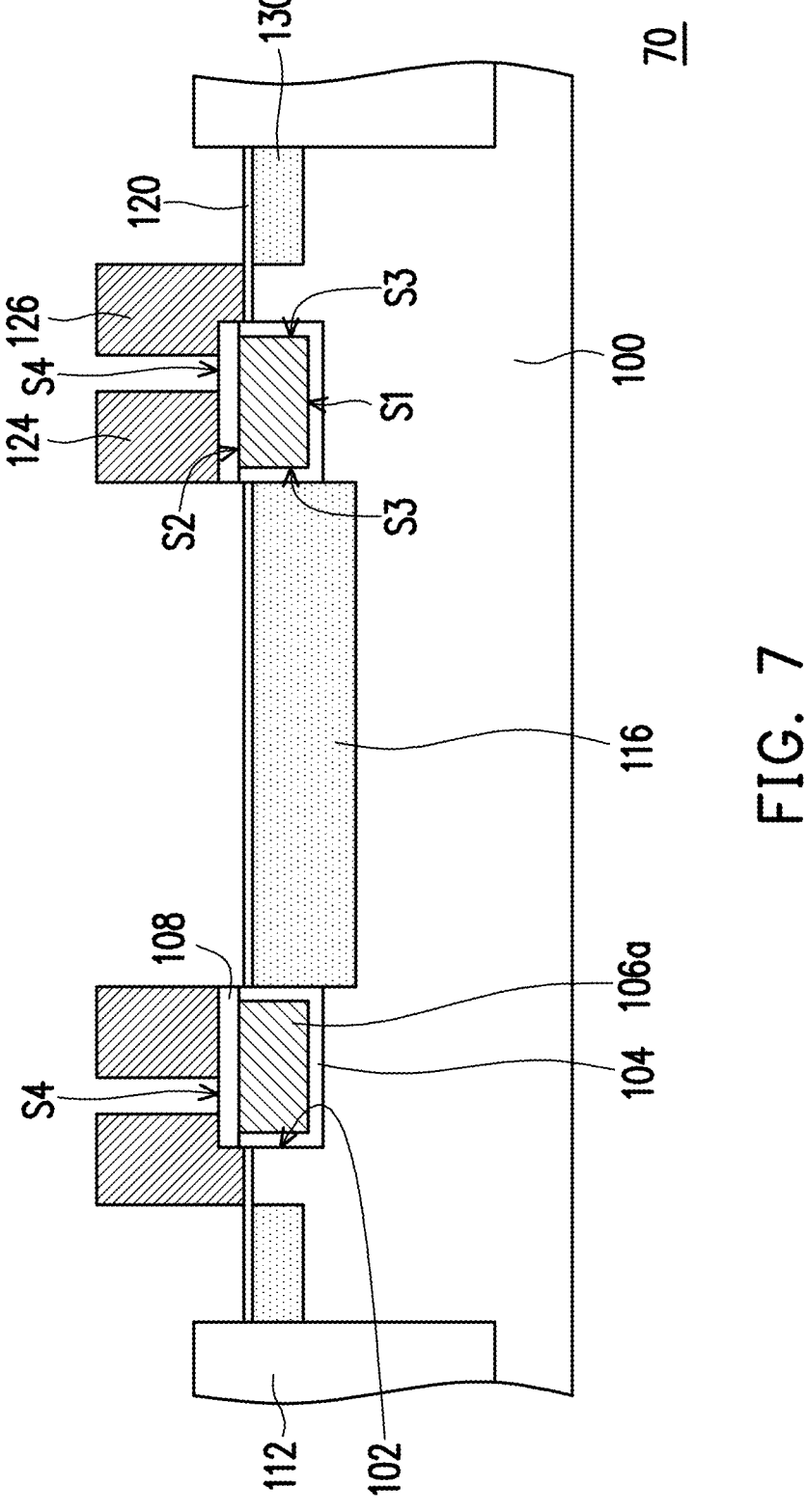
FIG. 7 is a schematic cross-sectional view of a flash memory according to a seventh embodiment of the present invention.

FIG. 7 is a schematic cross-sectional view of a flash memory according to a seventh embodiment of the present invention. In the present embodiment, the same elements as those of the first embodiment will be denoted by the same reference numerals and will not be described in detail.

Referring to FIG. 7, the difference between the flash memory 70 of the present embodiment and the flash memory 10 is that in the flash memory 70, a sidewall of the select gate 126 is located on the second dielectric layer 108. In detail, in the present embodiment, a sidewall of the select gate 126 is located on the third dielectric layer 120, and another sidewall of the select gate 126 is located on the second dielectric layer 108 directly above the floating gate 106a. Accordingly, the select gate 126 may be located on the floating gate 106a and the substrate 100 between the drain region 130 and the recess 102 simultaneously, and will not contact the erase gate 124.

In addition, in other embodiments, the setting of each element constituting the flash memory may be adjusted according to actual conditions, for example, the architectures of the above-mentioned embodiments may be combined, and the present invention is not limited thereto.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A flash memory, comprising:
   a floating gate, disposed in a substrate;
   a first dielectric layer, disposed between the floating gate and the substrate;
   a second dielectric layer, comprising a first top surface away from the substrate, covering a surface of the floating gate;
   a source region, disposed in the substrate at one side of the floating gate and in contact with the first dielectric layer;
   a drain region, disposed in the substrate at another side of the floating gate and separated from the first dielectric layer;
   an erase gate, disposed on the first top surface of the second dielectric layer;
   a select gate, disposed on the substrate between the floating gate and the drain region; and
   a third dielectric layer, disposed between the select gate and the substrate, wherein a sidewall of the erase gate is located on the first dielectric layer between the floating gate and the source region.

2. The flash memory of claim 1, wherein the floating gate is wrapped by the first dielectric layer and the second dielectric layer.

3. The flash memory of claim 1, wherein the source region extends to below the floating gate.

4. The flash memory of claim 1, wherein a sidewall of the erase gate is located above an interface between the first dielectric layer and the source region.

5. The flash memory of claim 1, wherein the third dielectric layer is further located on the source region.

6. The flash memory of claim 5, wherein a sidewall of the erase gate is located on the third dielectric layer above the source region.

7. The flash memory of claim 1, wherein both sidewalls of the erase gate are located above the floating gate.

8. The flash memory of claim 1, wherein a sidewall of the select gate is located on the second dielectric layer.

9. The flash memory of claim 1, wherein the floating gate comprises a bottom surface, a second top surface opposite to the bottom surface, and two side surfaces connecting to the second top surface and the bottom surface, and wherein the first dielectric layer covers the two side surfaces and the bottom surface.

10. The flash memory of claim 9, wherein the second dielectric layer covers the second top surface of the floating gate.

11. The flash memory of claim 1, wherein a material of the erase gate and a material of the select gate each comprises polysilicon or metal.

12. A manufacturing method of a flash memory comprising:
   forming a recess in a substrate;
   forming a floating gate in the recess;
   forming a first dielectric layer between the floating gate and the substrate;
   forming a second dielectric layer on a surface of the floating gate, wherein the second dielectric layer comprise a first top surface away from the substrate;
   forming a source region in the substrate at one side of the floating gate, wherein the source region is in contact with the first dielectric layer;
   forming a third dielectric layer on the substrate at another side of the floating gate;
   forming an erase gate on the first top surface of the second dielectric layer;
   forming a select gate on the third dielectric layer; and
   forming a drain region in the substrate at one side of the select gate away from the floating gate,
   wherein a sidewall of the erase gate is located on the first dielectric layer between the floating gate and the source region.

13. The manufacturing method of claim 12, wherein the forming the floating gate and the first dielectric layer comprises:
   forming a dielectric material layer on the substrate;
   forming a conductive material layer on the dielectric material layer, wherein the conductive material layer fills up the recess; and
   performing a chemical mechanical polishing process to remove a portion of the conductive material layer until exposing the dielectric material layer.

14. The manufacturing method of claim 12, wherein the forming the source region comprises:

forming a mask layer on the substrate, wherein the mask layer exposes a region aside the recess;

by using the mask layer as a mask, performing an etching process to expose a surface of the substrate aside the recess;

by using the mask layer as a mask, performing an ion implantation process; and removing the mask layer.

15. The manufacturing method of claim 12, wherein the forming the third dielectric layer comprises:

forming a mask layer on the substrate, wherein the mask layer exposes a region aside the recess;

by using the mask layer as a mask, performing an etching process to expose a surface of the substrate aside the recess;

removing the mask layer; and performing a thermal oxidation process.

16. The manufacturing method of claim 12, wherein the forming the erase gate and the select gate comprises:

forming a conductive material layer on the second dielectric layer and the third dielectric layer; and performing a patterning process on the conductive material layer.

17. The manufacturing method of claim 16, wherein after performing the patterning process, the method further comprises performing a gate replacement process.

18. The manufacturing method of claim 12, wherein the forming the drain region comprises:

forming a mask layer on the substrate, wherein the mask layer exposes a region aside the select gate;

by using the mask layer as a mask, performing an ion implantation process; and removing the mask layer.

19. The manufacturing method of claim 12, further comprising forming an isolation structure in the substrate.

\* \* \* \* \*